United States Patent
Nakazato et al.

(10) Patent No.: US 10,571,513 B2
(45) Date of Patent: Feb. 25, 2020

(54) INTEGRATED CIRCUIT

(71) Applicants: KABUSHIKI KAISHA TOSHIBA, Minato-ku (JP); Toshiba Electronic Devices & Storage Corporation, Minato-ku (JP)

(72) Inventors: Masato Nakazato, Kawasaki (JP); Yuki Watanabe, Funabashi (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/122,394

(22) Filed: Sep. 5, 2018

(65) Prior Publication Data
US 2019/0293710 A1 Sep. 26, 2019

(30) Foreign Application Priority Data
Mar. 23, 2018 (JP) .................. 2018-055789

(51) Int. Cl.
*G01R 31/28* (2006.01)
*G05F 1/565* (2006.01)

(52) U.S. Cl.
CPC ......... *G01R 31/2851* (2013.01); *G05F 1/565* (2013.01)

(58) Field of Classification Search
CPC ............................ G01R 31/2851; G05F 1/565
USPC .................. 324/500, 509, 512, 515, 531
See application file for complete search history.

(56) References Cited

U.S. PATENT DOCUMENTS

| | | | | |
|---|---|---|---|---|
| 3,858,159 A | * | 12/1974 | Worth ................. | H01R 12/675 439/399 |
| 6,392,317 B1 | * | 5/2002 | Hall ..................... | E21B 17/003 174/47 |
| 2006/0178047 A1 | * | 8/2006 | Croan ................ | H01R 13/6272 439/578 |

FOREIGN PATENT DOCUMENTS

| | | |
|---|---|---|
| JP | 7-98359 | 4/1995 |
| JP | 3043716 | 5/2000 |
| JP | 2012-159454 | 8/2012 |

* cited by examiner

*Primary Examiner* — Giovanni Astacio-Oquendo
(74) *Attorney, Agent, or Firm* — Oblon, McClelland, Maier & Neustadt, L.L.P.

(57) ABSTRACT

According to one embodiment, there is provided an integrated circuit which includes a power switch including first transistors, and a circuit that outputs information based on impedance according to presence or absence of a fault of at least one transistor among the first transistors.

12 Claims, 6 Drawing Sheets

Example of equivalent circuit when there is no fault

FIG. 3

Example of equivalent circuit when there is fault

Example of equivalent circuit when there is no fault

FIG. 6

Example of equivalent circuit when there is fault

INTEGRATED CIRCUIT

CROSS-REFERENCE TO RELATED APPLICATIONS

This application is based upon and claims the benefit of priority from Japanese Patent Application No. 2018-055789, filed Mar. 23, 2018, the entire contents of which are incorporated herein by reference.

FIELD

Embodiments described herein relate generally to an integrated circuit.

BACKGROUND

Generally, a power switch provided in a semiconductor integrated circuit is constituted by a plurality of metal-oxide-semiconductor field-effect-transistors (MOSFETs) (hereinafter referred to as "transistors") connected in parallel.

Conventionally, when a test is performed on the transistors constituting the power switch, a fault is indirectly detected by performing a pass/fail determination of a scan test and a memory test based on operation specifications of a device. However, in such a technique, it is difficult to deterministically test the individual transistors constituting the power switch, and it is difficult to specify a transistor having a fault.

DETAILED DESCRIPTION

Hereinafter, embodiments will be described with reference to the accompanying drawings. In the following description, constituent elements having the same functions and configurations will be denoted by the same reference signs.

In general, according to one embodiment, there is provided an integrated circuit which includes a power switch including first transistors, and a circuit that outputs information based on impedance according to presence or absence of a fault of at least one transistor among the first transistors.

<Basic Configuration>

Figure 1:
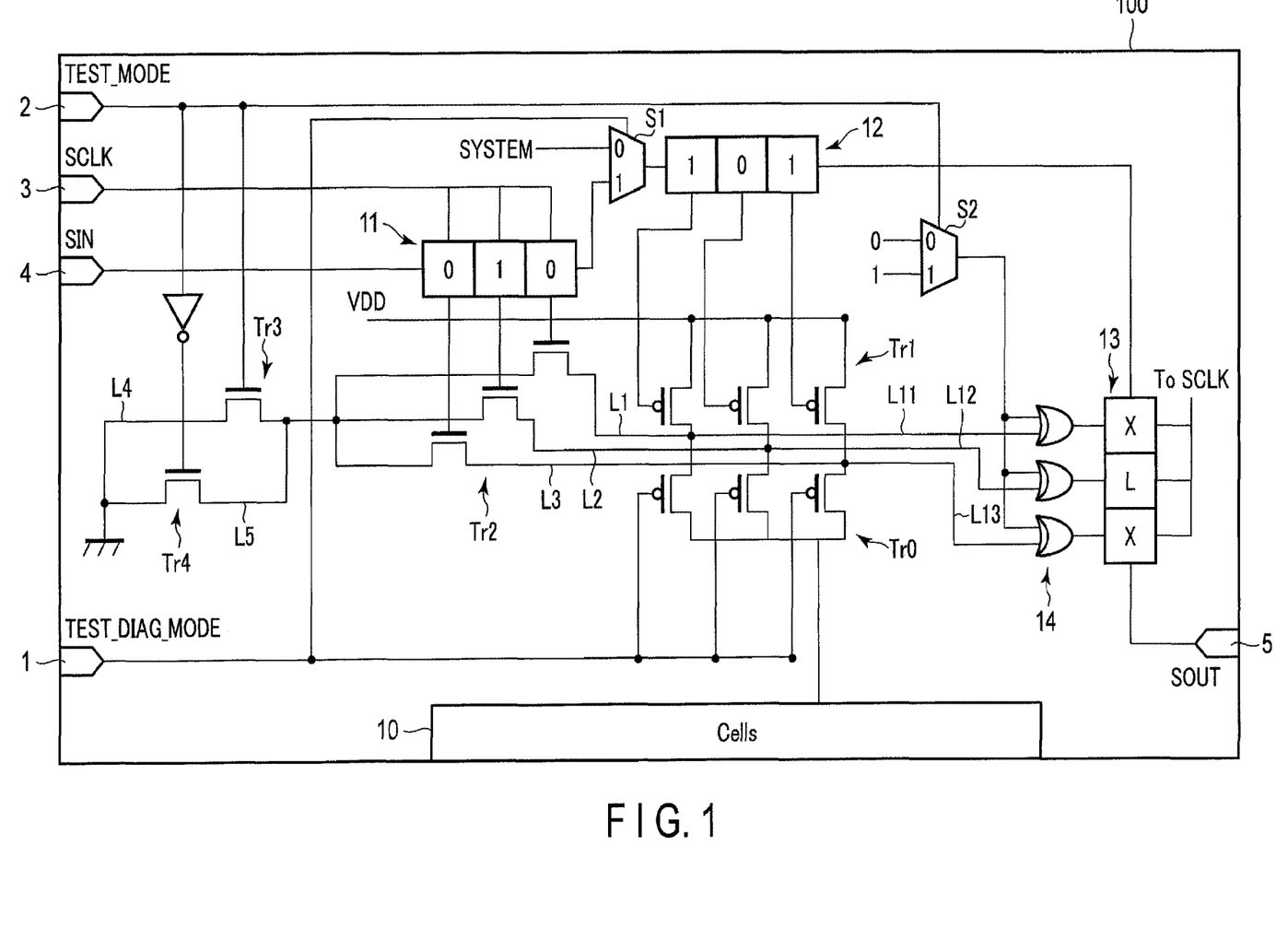
FIG. 1 is a diagram illustrating an example of a configuration of a semiconductor integrated circuit according to an embodiment.

FIG. 1 is a diagram illustrating an example of a configuration of a semiconductor integrated circuit according to one embodiment. The configuration of FIG. 1 is an example and is not limited to this example. The configuration may be implemented with a change, for example, by exchanging levels "low" and "high" of various signals and logical values "0" and "1", and the like as appropriate.

A semiconductor integrated circuit 100 illustrated in FIG. 1 includes external terminals 1 to 5, cells 10, registers 11 to 13, comparators 14, selectors S1 and S2, transistors Tr0 to Tr4, signal lines L1 to L5, and the like.

Among these elements, the transistors Tr1 correspond to a power switch of the cells 10, and each of the transistors Tr1 is a target of fault diagnosis and a test. Here, a case where the number of the transistors Tr1 is three is exemplified, but the number of transistors is not limited thereto.

The semiconductor integrated circuit 100 of the present embodiment includes circuits which output information based on impedance according to presence or absence of a fault of at least one transistor among the transistors Tr1 constituting the power switch. The circuits include a set of other transistors Tr2 and Tr3 connected in series with a transistor Tr1 as a test target or a set of transistors Tr2 and Tr4, and further include a signal line L11, L12, or L13 to transmit information indicating a voltage of a point of the series connection.

The external terminal (TEST_DIAG_MODE) 1 is an input terminal which inputs a mode designation signal for designating either a normal operation mode or a test mode.

For example, the mode designation signal represents the designation of the normal operation mode using a value of "0" (TEST_DIAG_MODE=0) and the designation of the test mode using a value of "1" (TEST_DIAG_MODE=1).

The external terminal (TEST_MODE) 2 is an input terminal which inputs a test type designation signal for designating a test type.

Examples of the test type include a test on a "power switch constantly-on fault" and a test on a "power switch constantly-off fault".

For example, the test type designation signal represents the designation of the test on the "power switch constantly-on fault" using a value of "0" (TEST_MODE=0), and the designation of the test on the "power switch constantly-off fault" using a value of "1" (TEST_MODE=1).

The external terminal (SCLK) 3 is an input terminal which inputs a clock signal for a test mode in the test mode.

The external terminal (SIN) 4 is an input terminal which inputs (scans in) test pattern data in the test mode.

The external terminal (SOUT) 5 is an output terminal which outputs (scans out) data including a test result in the test mode.

The cells 10 are memory cells constituting, for example, a static random access memory (SRAM) or the like.

The register 11 operates as a shift register which sequentially sends out test pattern data, for example, configured using a combination of "0" and "1" in synchronization with the clock signal supplied from the external terminal 3 in the test mode. The value "0" or "1" in the register 11 causes an on-state or an off-state of each of the transistors Tr2.

The register 12 operates as a shift register which sequentially sends out data supplied from the system in the normal operation mode and the test pattern data in the test mode, in synchronization with the clock signal supplied from the external terminal 3. The value "0" or "1" in the register 12 causes an on-state or an off-state of each of the transistors Tr1.

Although the register 12 is originally an element arranged together with the transistors Tr1 for use in the normal operation, it is configured such that the register 12 can be used in both the normal operation mode and the test mode in the present embodiment.

The registers 11 and 12 form one path through the selector S1 in the test mode. The test pattern data including information to instruct selection of the transistor Tr1 as the test target and information to instruct whether to turn on or off the transistor Tr1 as the test target flows to the registers 11 and 12.

The register 13 operates as a shift register which sequentially sends out data including the test result in the test mode. The register 13 sequentially sends out any of information indicating "absence of a fault (L)" (for example, a value "0"), information indicating "presence of a fault (H)" (for example, a value "1"), and information indicating "no test (X)" (for example, "Null") regarding the transistor Tr1 as the test target, in synchronization with the clock signal supplied from the external terminal 3. The sent-out information is output from the external terminal 5 to the outside, and the presence or absence of the fault of the transistor Tr1 as the test target is verified based on the information.

The comparator group 14 is an operation element which inputs information transmitted through each of the signal lines L1, L2, and L3 in form of a logical value, inputs an expectation value supplied from the selector S2, and compares the two input values to output a result of the comparison. For example, each comparator outputs a value "0" (corresponding to a level "L") indicating "absence of a fault" when the two input values match, and output a value "1" (corresponding to a level "H") indicating "presence of a fault" when the two input values do not match.

The selector S1 is configured using, for example, a multiplexer, and selects an input destination in accordance with the mode designation signal supplied from the external terminal 1.

For example, when the mode designation signal designates the "normal operation mode" (TEST_DIAG_MODE=0), the selector S1 forms a path for transmitting the data sent from the system to the register 12 side. On the other hand, when the mode designation signal designates the "test mode" (TEST_DIAG_MODE=1), the selector Si forms a path for transmitting the data sent from the register 11 to the register 12 side.

The selector S2 is configured using, for example, a multiplexer, and selects an input destination in accordance with the test type designation signal supplied from the external terminal 2. For example, when the test type designation signal designates the test on the "power switch constantly-on fault" (TEST_MODE=0), the selector S2 outputs the value of "0" to the comparator group 14 side. On the other hand, when the test type designation signal designates the test on the "power switch constantly-off fault" (TEST_MODE=1"), the selector S2 outputs the value of "1" to the comparator group 14 side.

The transistors Tr0 are switches which switch an electrical connection state and a disconnection state between the cells 10 and the transistors Tr1 in accordance with the mode designation signal supplied from the external terminal 1. For example, when the mode designation signal designates the "normal operation mode" (TEST_DIAG_MODE=0), the transistors Tr0 are turned on and electrically connect the cells 10 and the transistors Tr1. On the other hand, when the mode designation signal designates the "test mode" (TEST_DIAG_MODE=1), the transistors Tr0 are turned off and electrically disconnect the cells 10 from the transistors Tr1.

Incidentally, the transistors Tr0 are not necessarily installed. If it is possible to realize the electrical connection and disconnection between the cells 10 and the transistors Tr1 or to fix the cells 10 in the state of not operating, it may be realized by an existing element or another means.

As described above, the transistors Tr1 correspond to a power switch of the cells 10, and each of the transistors Tr1 becomes the target of the fault diagnosis and the test.

Each of the transistors Tr1 is turned on or off depending on the value supplied from the register 12. For example, when the value supplied from the register 12 is "0", the transistor Tr1 is turned on. At this time, if the corresponding transistor Tr0 is in the on-state, a power supply voltage VDD is supplied to the cells 10. On the other hand, when the value supplied from the register 12 is "1", the transistor Tr1 is turned off. At this time, the power supply voltage VDD is not supplied to the cells 10 side.

The transistors Tr2 are connected in series with the transistors Tr1, respectively, through the signal line L1, L2, or L3. The transistors Tr2 are switches which electrically connect the corresponding transistor Tr1 to the transistor Tri or Tr4. The transistor Tr1 connected to, for example, the transistor Tr2 in the on-state among the transistors Tr2 becomes a test target.

Each of the transistors Tr2 is turned on or off depending on the value supplied from the register 11. For example, when the value supplied from the register 11 is "1", the transistor Tr2 is turned on and electrically connects the corresponding transistor Tr1 and the transistor Tr3 or Tr4. On the other hand, when the value supplied from the register 11 is "0", the transistor Tr2 is turned off and electrically disconnects the corresponding transistor Tr1 from the transistors Tr3 and Tr4. It is assumed that on-resistances (resistances at the time of conduction) of the respective transistors Tr2 are the same.

The transistor Tr3 and the transistor Tr4 are connected in parallel. The transistor Tr3 is provided on the signal line L4 and is connected to the transistors Tr1 via the transistors Tr2. On the other hand, the transistor Tr4 is provided on the signal line L5 and is connected to the transistors Tr1 via the transistors Tr2.

The transistors Tr3 and Tr4 are switch groups either one of which is turned on in accordance with the test type designation signal supplied from the external terminal 2. For example, when the test type designation signal designates the test on the "power switch constantly-on fault" (TEST_MODE=0), the transistor Tr4 is turned on. On the other hand, when the test type designation signal designates the test on the "power switch constantly-off fault" (TEST_MODE=1), the transistor Tr3 is turned on.

The transistor Tr3 is electrically connected to the corresponding transistor Tr1 through the transistor Tr2 in the on-state. Similarly, the transistor Tr4 is electrically connected to the corresponding transistor Tr1 through the transistor Tr2 in the on-state. It is assumed that an on-resistance (resistance at the time of conduction) of the transistor Tr3 is smaller than an on-resistance (resistance at the time of conduction) of the transistor Tr4.

Next, a relationship among impedances (on-resistances) of the transistors Tr1, Tr2, Tr3 and Tr4 will be described.

<Conditions to Enable Diagnosis and Test on "Power Switch Constantly-Off Fault">

In order to enable diagnosis and a test on the "power switch constantly-off fault" for each of the transistors Tr1, the transistors Tr2 and Tr3 which satisfy the following relationship among the transistors Tr1, Tr2 and Tr3 are mounted.

$$Z_{Tr1\_on} < (Z_{Tr2\_on} + Z_{Tr3\_on}) < Z_{Tr1\_fault\_off} \quad (1)$$

Here, $Z_{Tr1\_on}$ is an ideal on-resistance of Tr1, $Z_{Tr2\_on}$ is an on-resistance of Tr2, $Z_{Tr3\_on}$ is an on-resistance of Tr3, and $Z_{Tr1\_fault\_off}$ is an off-resistance when Tr1 has a constantly-off fault That is, it is configured such that a value obtained by combining the ideal on-resistance of the transistor Tr2 and the ideal on-resistance of the transistor Tr3 is smaller than a value of the off-resistance of the transistor Tr1 having the constantly-off fault and is larger than the ideal on-resistance value of the transistor Tr1.

<Conditions to Enable Diagnosis and Test on "Power Switch Constantly-On Fault">

In order to enable diagnosis and a test on the "power switch constantly-on fault" for each of the transistors Tr1, the transistors Tr2 and Tr4 which satisfy the following relationship among the transistors Tr1, Tr2 and Tr4 are mounted.

$$Z_{Tr1\_fault\_on} < (Z_{Tr2\_on} + Z_{Tr4\_on}) < Z_{Tr1\_off} \quad (2)$$

Here, $Z_{Tr1\_fault\_on}$ is an on-resistance of Tr1 having the constantly-on fault, $Z_{Tr2\_on}$ is the on-resistance of Tr2, $Z_{Tr4\_on}$ is the on-resistance of Tr4, and $Z_{Tr1\_off}$ is an ideal off-resistance of Tr1

That is, it is configured such that a value obtained by combining the ideal on-resistance of the transistor Tr2 and the ideal on-resistance of the transistor Tr4 is smaller than the ideal off-resistance value of the transistor Tr1, and is larger than a value of the on-resistance of the transistor Tr1 having the constantly-on fault.

Although the case where one transistor Tr2 is provided for one transistor Tr1 is illustrated in the example of FIG. 1, it may be configured by replacing this one transistor Tr2 by a group of a plurality of transistors. In this case, it is configured such that a combined resistance of on-resistances of the plurality of transistors is the same as the on-resistance of the one transistor Tr2. In this manner, even if some of the transistors vary in on-resistance, a fluctuation of the on-resistance of the transistor Tr2 is small so that it is possible to maintain high stability. Each of the transistors Tr3 and Tr4 may also be configured to be replaced by a group of a plurality of transistors.

In the example of FIG. 1, a case where a device, which performs a test by supplying the test pattern data and collecting test results, is provided outside the semiconductor integrated circuit 100 has been illustrated. Instead, it may be configured such that the device which performs the test is arranged inside the semiconductor integrated circuit 100 as a built-in self-test (BIST) circuit.

<Example of Method for Verifying Presence or Absence of "Power Switch Constantly-Off Fault">

Next, an example of a method for verifying the presence or absence of the "power switch constantly-off fault" will be described with reference to FIGS. 2 to 4.

Figure 2:
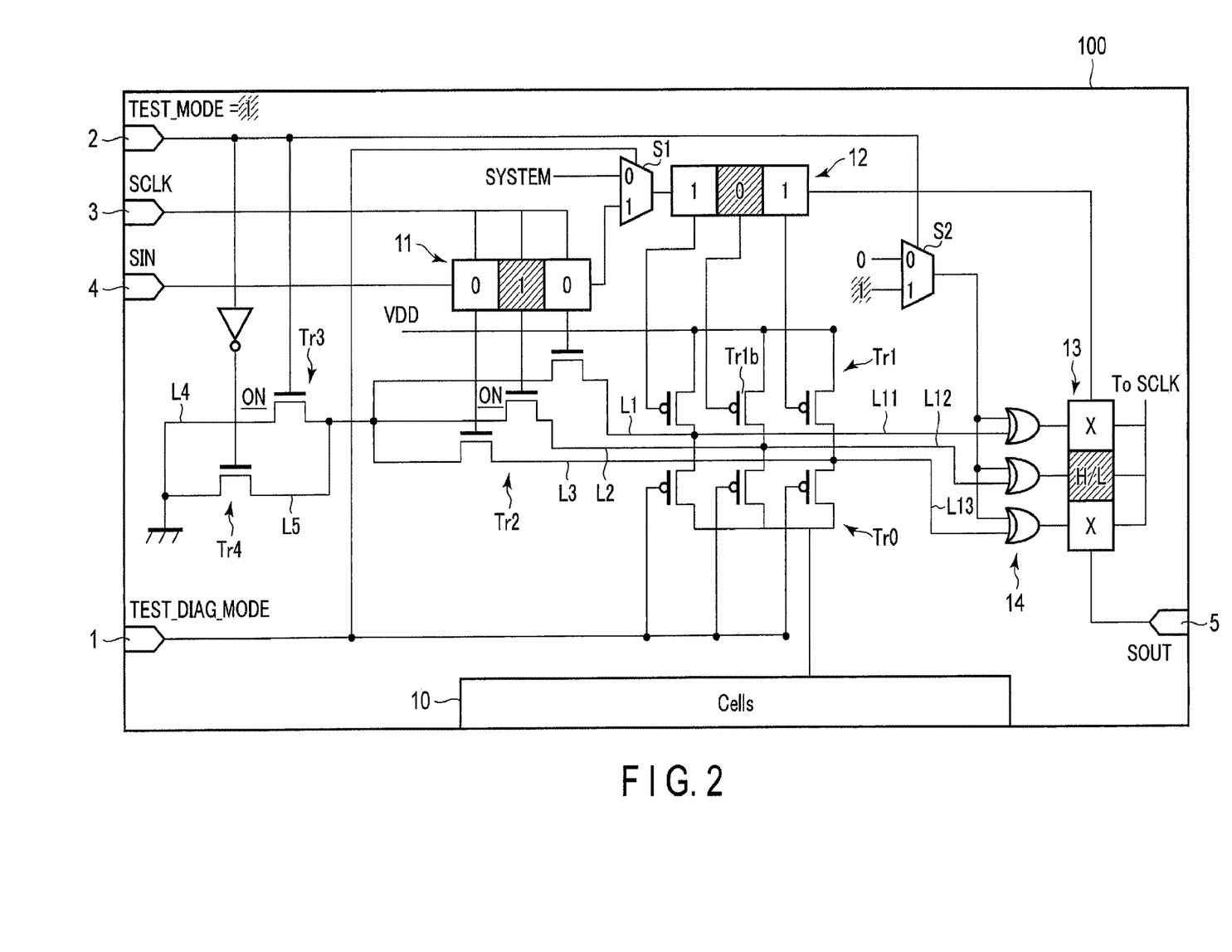
FIG. 2 is a schematic diagram illustrating an example of a scene in which presence or absence of a "power switch constantly-off fault" is verified.

FIG. 2 is a schematic diagram illustrating an example of a scene in which the presence or absence of the "power switch constantly-off fault" is verified in the semiconductor integrated circuit 100.

In the example of FIG. 2, a transistor Tr1b among the transistors Tr1 connected to the signal line L2 is a test target.

The mode designation signal (TEST_DIAG_MODE=1) for designating the test mode is input from the external terminal 1, the transistors Tr0 are in the off-state, and the selector S1 forms the path for transmitting the data sent from the register 11 to the register 12 side.

The test type designation signal (TEST_MODE=1) for designating the test on the "power switch constantly-off fault" is input from the external terminal 2, the transistor Tr3 between the transistors Tr3 and Tr4 is in the on-state, and the selector S2 outputs the value of "1" to the comparator group 14 side.

The clock signal is input from the external terminal 3, and the clock signal is supplied to each of the registers 11 to 13.

The test pattern data is input from the external terminal 4.

Here, as illustrated in FIG. 2, the test pattern data supplied from the external terminal 4 to the registers 11 and 12 causes the value "0" in the register 12 to act such that the transistor Tr1b as the test target is turned on, and causes the value "1" in the register 11 to act such that the transistor Tr2 corresponding to the transistor Tr1b as the test target is turned on.

As a result, a path from the power supply voltage VDD to the ground is formed via the transistor Tr1b, the transistor Tr2 on the signal line L2, and the transistor Tr3 on the signal line L4.

At this time, the transistor Tr1b as the test target and a set of the corresponding transistors Tr2 and Tr3 are connected in series through the signal line L2. A voltage generated at a point of the series connection is transmitted to the corresponding comparator 14 through the signal line L12. The comparator 14 inputs a level of the voltage transmitted through the signal line L2 in form of a logical value "1" or "0", inputs an expectation value "1" supplied from the selector S2, and compares the two input values to output a result of the comparison.

For example, when the level of the voltage transmitted through the signal line L2 corresponds to the logical value "1", since the two input values match, the selector S2 outputs a value "0" (corresponding to the level "L") indicating "absence of a fault". On the other hand, when the level of the voltage transmitted through the signal line L2 corresponds to the logical value "0", since the two input values do not match, the selector S2 outputs a value "1" (corresponding to the level "H") indicating "presence of a fault".

The register 13 acquires the value "1" (corresponding to the level "H") indicating "presence of a fault" or the value "0" (corresponding to the level "L") indicating "absence of a fault regarding the transistor Tr1b as the test target from the comparator 14, and outputs the acquired value to the external terminal 5 side.

Figure 3:
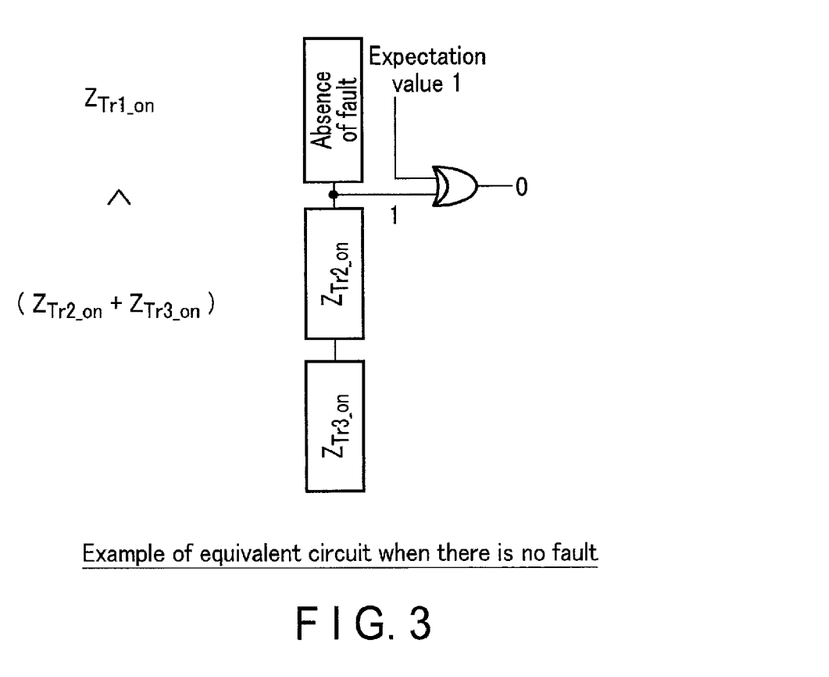
FIG. 3 is a schematic diagram illustrating an example of an equivalent circuit formed when there is no constantly-off fault.

FIG. 3 is a schematic diagram illustrating an example of an equivalent circuit formed when there is no constantly-off fault. On the other hand, FIG. 4 is a schematic diagram illustrating an example of an equivalent circuit formed when there is a constantly-off fault.

As illustrated in FIG. 3, a situation where the constantly-off fault does not occur in the transistor Tr1 corresponds to the relationship of "$Z_{Tr1\_on} < (Z_{Tr2\_on} + Z_{Tr3\_on})$" in the above-described Formula (1). In this case, a voltage between the transistor Tr1 and the transistors Tr2 and Tr3 exceeds a predetermined threshold and reaches a level satisfying the logical value "1". Since this logical value "1" matches the expectation value "1", the selector S2 outputs the value "0" (corresponding to the level "L") indicating "absence of a fault".

Figure 4:
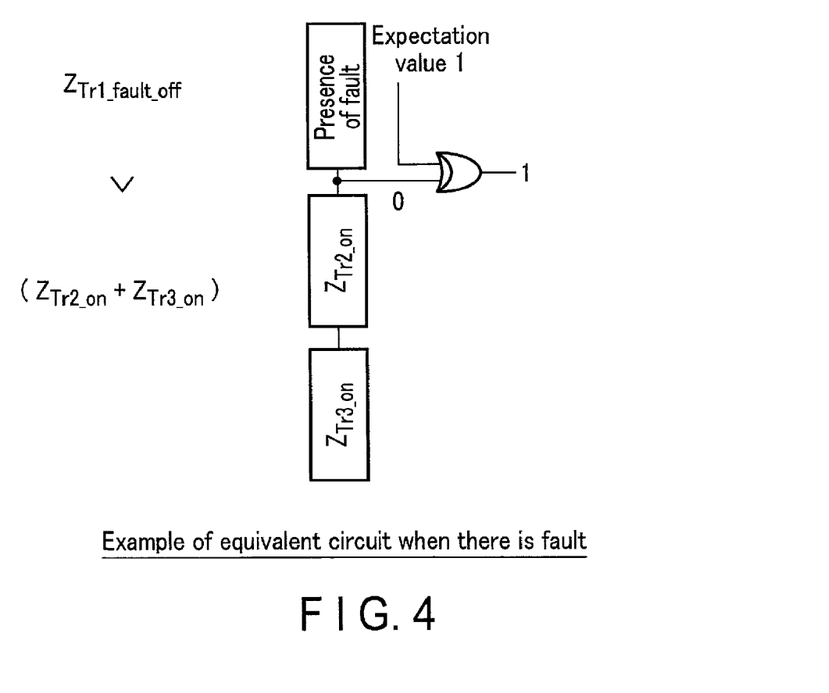
FIG. 4 is a schematic diagram illustrating an example of an equivalent circuit formed when there is a constantly-off fault.

On the other hand, as illustrated in FIG. 4, a situation where the constantly-off fault occurs in the transistor Tr1 corresponds to the relationship of "$(Z_{Tr2\_on}+Z_{Tr3\_on})<Z_{Tr1\_fault\_off}$" in the above-described Formula (1). In this case, the voltage between the transistor Tr1 and the transistors Tr2 and Tr3 falls below the predetermined threshold and becomes a level satisfying the logical value "0". Since this logical value "0" does not match the expectation value "1", the selector S2 outputs the value "1" (corresponding to the level "H") indicating "presence of a fault".

<Example of Method for Verifying Presence or Absence of "Power Switch Constantly-On Fault">

Next, an example of a method for verifying the presence or absence of the "power switch constantly-on fault" will be described with reference to FIGS. 5 to 7.

Figure 5:
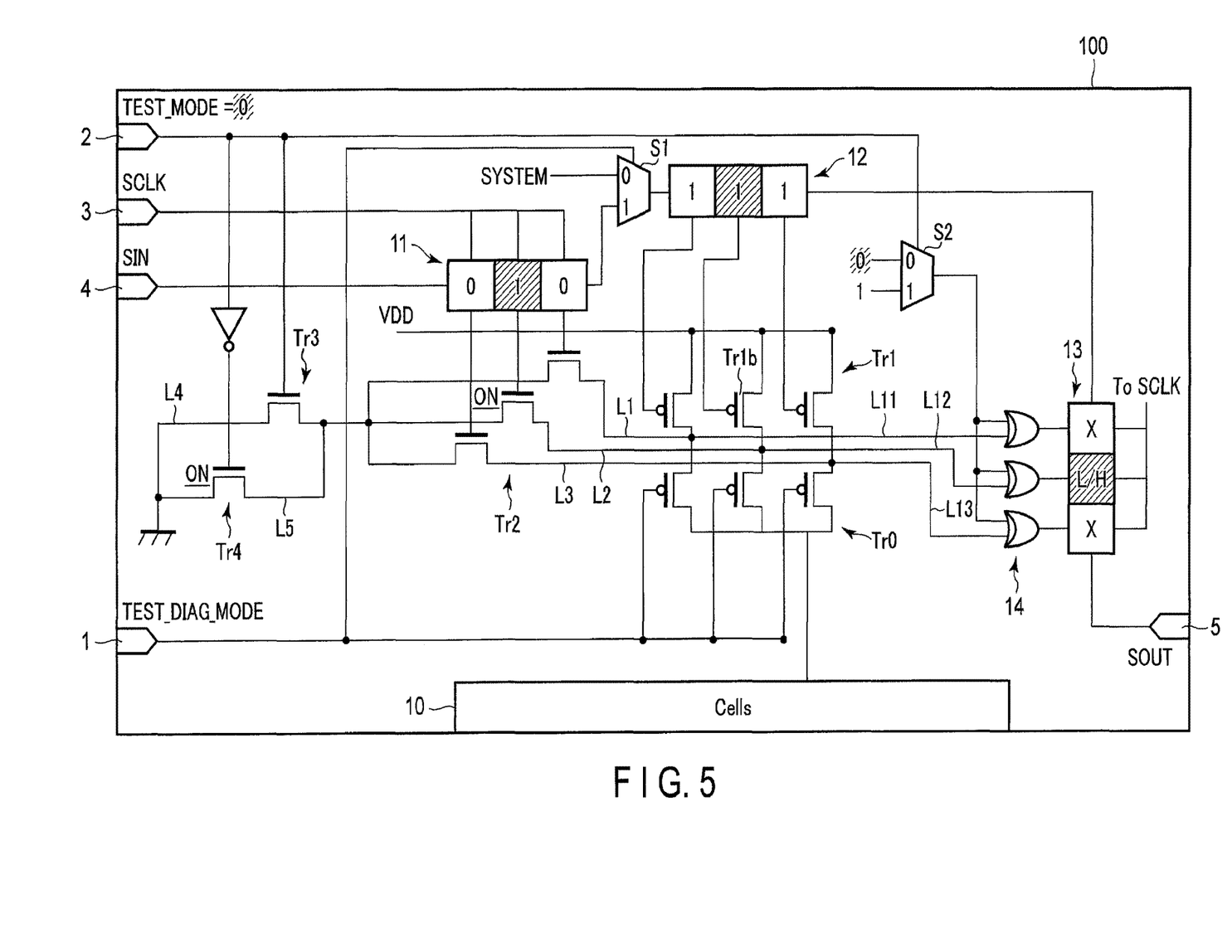
FIG. 5 is a schematic diagram illustrating an example of a scene in which presence or absence of a "power switch constantly-on fault" is verified.

FIG. 5 is a schematic diagram illustrating an example of a scene in which the presence or absence of the "power switch constantly-on fault" is verified in the semiconductor integrated circuit 100.

In the example of FIG. 5, the transistor Tr1b among the transistors Tr1 connected to the signal line L2 is the test target.

The mode designation signal (TEST_DIAG_MODE=1) for designating the test mode is input from the external terminal 1, the transistors Tr0 are in the off-state, and the selector S1 forms the path for transmitting the data sent from the register 11 to the register 12 side.

The test type designation signal (TEST_MODE=0) for designating the test on the "power switch constantly-on fault" is input from the external terminal 2, the transistor Tr4 between the transistors Tri and Tr4 is in the on-state, and the selector S2 outputs the value of "0" to the comparator group 14 side.

The clock signal is input from the external terminal 3, and the clock signal is supplied to each of the registers 11 to 13.

The test pattern data is input from the external terminal 4.

Here, as illustrated in FIG. 2, the test pattern data supplied from the external terminal 4 to the registers 11 and 12 causes the value "1" in the register 12 to act such that the transistor Tr1b as the test target is turned on, and causes the value "1" in the register 11 to act such that the transistor Tr2 corresponding to the transistor Tr1b as the test target is turned on.

As a result, a path from the power supply voltage VDD to the ground is formed via the transistor Tr1b, the transistor Tr2 on the signal line L2, and the transistor Tr4 on the signal line L5.

At this time, the transistor Tr1b as the test target and a set of the corresponding transistors Tr2 and Tr4 are connected in series through the signal line L2. A voltage generated at a point of the series connection is transmitted to the corresponding comparator 14 through the signal line L12. The comparator 14 inputs a level of the voltage transmitted through the signal line L2 in form of a logical value "0" or "1", inputs an expectation value "0" supplied from the selector S2, and compares the two input values to output a result of the comparison.

For example, when the level of the voltage transmitted through the signal line L2 corresponds to the logical value "0", since the two input values match, the selector S2 outputs the value "0" (corresponding to the level "L") indicating "absence of a fault". On the other hand, when the level of the voltage transmitted through the signal line L2 corresponds to the logical value "1", since the two input values do not match, the selector S2 outputs the value "1" (corresponding to the level "H") indicating "presence of a fault".

The register 13 acquires the value "0" (corresponding to the level "L") indicating "absence of a fault" or the value "1" (corresponding to the level "H") indicating "presence of a fault regarding the transistor Tr1b as the test target from the comparator 14, and outputs the acquired value to the external terminal 5 side.

Figure 6:
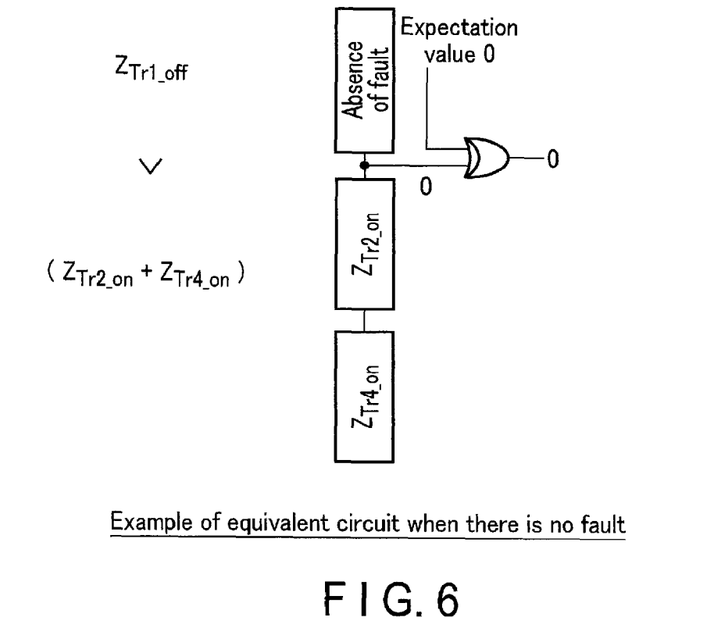
FIG. 6 is a schematic diagram illustrating an example of an equivalent circuit formed when there is no constantly-on fault.

FIG. 6 is a schematic diagram illustrating an example of an equivalent circuit formed when there is no constantly-on fault. On the other hand, FIG. 7 is a schematic diagram illustrating an example of an equivalent circuit formed when there is a constantly-on fault.

As illustrated in FIG. 6, a situation where the constantly-on fault does not occur in the transistor Tr1 corresponds to the relationship "$Z_{Tr2\_on}+Z_{Tr4\_on})<Z_{Tr1\_off}$" in the above-described Formula (2). In this case, the voltage between the transistor Tr1 and the transistors Tr2 and Tr4 falls below the predetermined threshold and becomes a level satisfying the logical value "0". Since this logical value "0" matches the expectation value "0", the selector S2 outputs the value "0" (corresponding to the level "L") indicating "absence of a fault".

Figure 7:
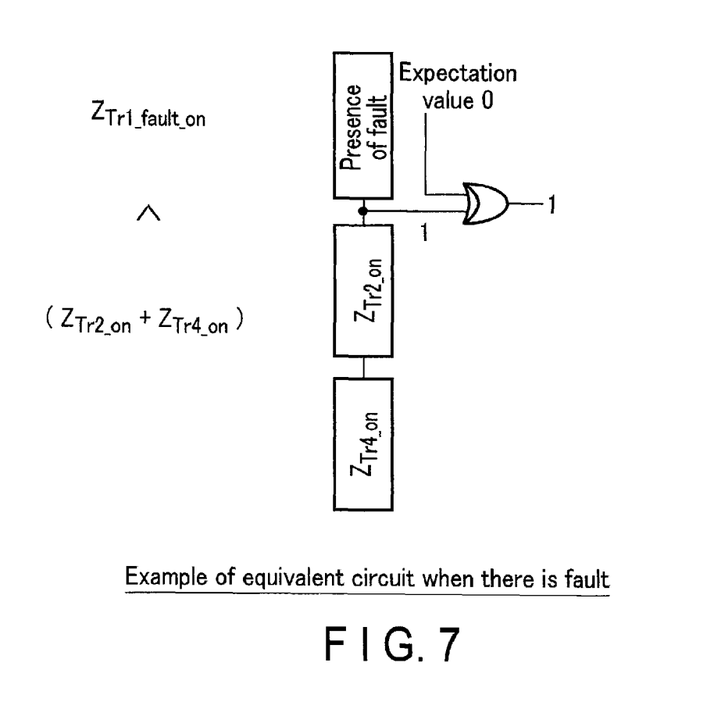
FIG. 7 is a schematic diagram illustrating an example of an equivalent circuit formed when there is a constantly-on fault.

On the other hand, as illustrated in FIG. 7, a situation where the constantly-on fault occurs in the transistor Tr1 corresponds to the relationship of "$Z_{Tr1\_fault\_on}<(Z_{Tr2\_on}+Z_{Tr4\_on})$" in the above-described Formula (2). In this case, a voltage between the transistor Tr1 and the transistors Tr2 and Tr4 exceeds a predetermined threshold and reaches a level satisfying the logical value "1". Since this logical value "1" does not match the expectation value "0", the selector S2 outputs the value "1" (corresponding to the level "H") indicating "presence of a fault".

Figure 8:
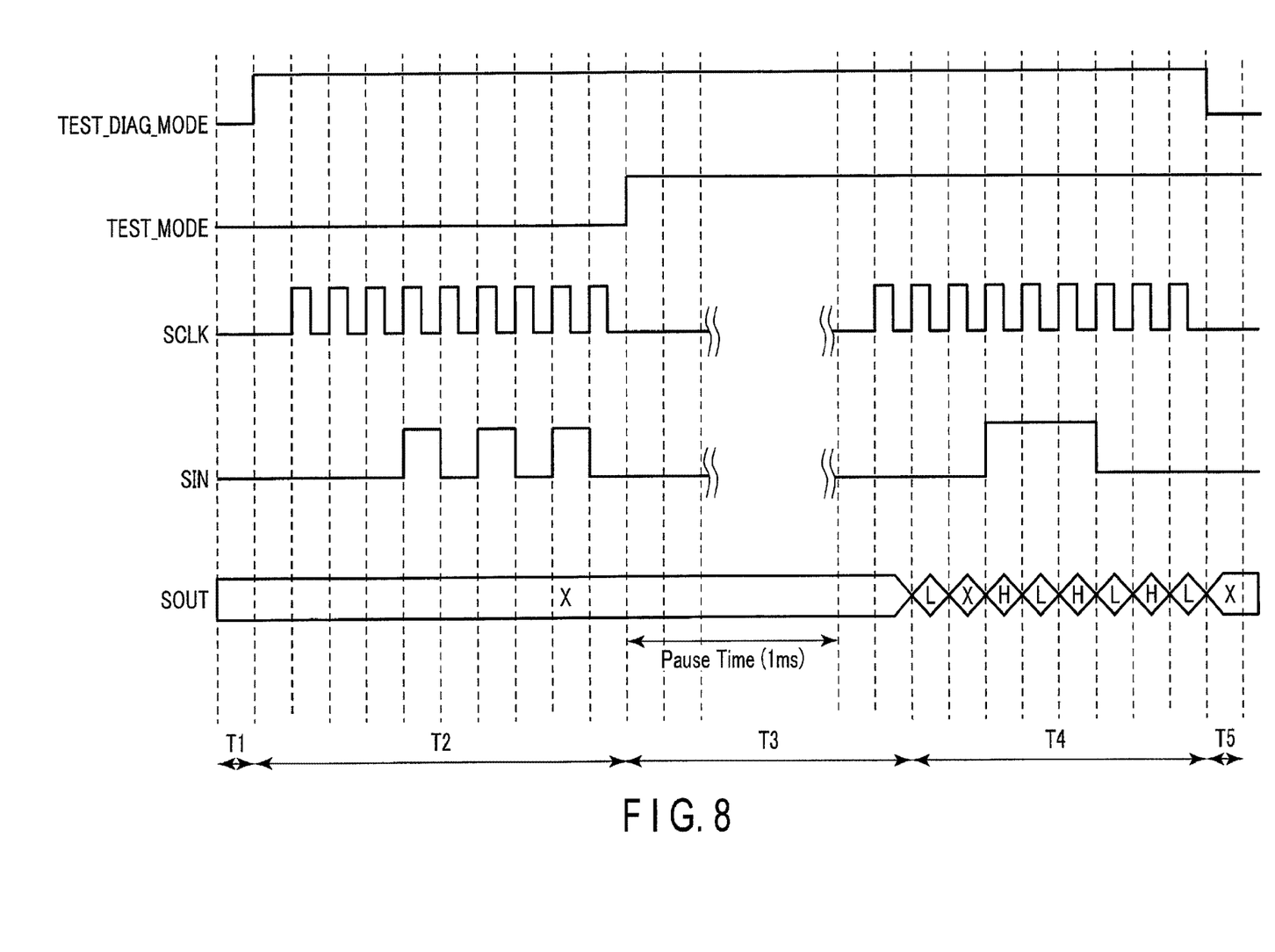
FIG. 8 is a time chart illustrating an example of an operation related to a test mode in the same embodiment.

Next, an example of an operation related to the test mode in the present embodiment will be described with reference to a time chart of FIG. 8.

During a period T1, the mode designation signal (TEST_DIAG_MODE) has not yet designated the test mode and is in the state of designating the normal operation mode. At this time, the transistors Tr0 are in the on-state, and the selector S1 forms the path for transmitting the data sent from the system to the register 12 side.

In addition, the test type designation signal (TEST_MODE) designates the test on the "power switch constantly-on fault", for example, as the initial setting during the period T1. At this time, the transistor Tr4 between the transistors Tr1 and Tr4 is in the on-state, and the selector S2 outputs the value of "0" to the comparator group 14 side.

However, s test mode clock (SCLK) has not yet been supplied from the external terminal (SIN) 3, and the test pattern data has not been supplied from the external terminal (SOUT) 4. In addition, no significant data has been output from the external terminal 5.

During a period T2, the designation of the mode designation signal (TEST_DIAG_MODE) is switched from the normal operation mode to the test mode.

In addition, the supply of the test mode clock (SCLK) is started during the period T2 so that the supply of the test pattern data is started.

However, the comparator group 14 has not yet performed the comparison processing with the expectation value, the register 13 has not acquired a test result, and no significant data has been output from the external terminal 5.

During a period T3, the test type designation signal (TEST_MODE) designates the test on the "power switch constantly-off fault". At this time, the transistor Tr3 between the transistors Tr3 and Tr4 is switched to the on-state, and the selector S2 outputs the value of "1" to the comparator group 14 side.

At this time, an output voltage fluctuates so that the supply of the test mode clock (SCLK) from the external terminal (SIN) 3 is suspended during a period until the fluctuation converges.

During a period T4, the supply of the test mode clock (SCLK) from the external terminal (SIN) 3 is restarted, and the test pattern data input from the external terminal (SIN) 4 is sent to the registers 11 and 12.

In addition, the path from the power supply voltage VDD to the ground is formed via the transistor Tr1 as the test target, the transistor Tr2 corresponding thereto, and the transistor Tr3 on the signal line L4 due to the action of the data sent to each of the registers 11 and 12 during the period T4. At this time, a voltage generated at a point between the transistor Tr1 and the transistor Tr2 as the test target is transmitted to the corresponding comparator 14.

The comparator 14 compares the two input values and outputs a result of the comparison. The comparison result is any of information indicating "absence of a fault (L)" (for example, the value "0"), information indicating "presence of a fault (H)" (for example, the value "1"), and information indicating "no test (X)" (for example, "Null"). The comparison result is output from the external terminal (SOUT) 5 as the test result, and the presence or absence of a fault of the transistor Tr1 as the test target is verified based on the result.

When "presence of a fault (H)" is recognized, the transistor Tr1 as the test target is specified as a transistor in which a "constantly-off fault" has occurred.

During a period T5, a state where the processing with one transistor Tr1 as the test target has ended is formed. Thereafter, processing with another transistor Tr1 as a test target is repeated. In addition, processing for the test on the "power switch constantly-on fault" is also performed after the processing for the test on the "power switch constantly-off fault.

As described in detail above, according to the embodiment, it is possible to provide the integrated circuit which makes it possible to detect a fault for each transistor of the power switch and to specify a faulty transistor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. An integrated circuit comprising:
   a power switch including first transistors; and
   a circuit that outputs information based on impedance according to presence or absence of a fault of at least one transistor among the first transistors.

2. The integrated circuit according to claim 1, wherein the circuit outputs the information in form of a logical value.

3. The integrated circuit according to claim 1, wherein the circuit inputs information to control the first transistors.

4. The integrated circuit according to claim 1, wherein the circuit comprises:
   another transistor which is connected in series with a transistor as a test target, and
   a signal line that transmits information indicating a voltage of a point of the series connection.

5. The integrated circuit according to claim 4, wherein the circuit further comprises an operation element that outputs a result of a comparison between the information transmitted through the signal line and an expectation value.

6. The integrated circuit according to claim 1, wherein the circuit comprises a register that sequentially sends out information to instruct selection of a transistor as a test target and information to instruct whether to turn on or off the transistor as the test target.

7. The integrated circuit according to claim 1, wherein the circuit comprises second transistors which are connected in series with the first transistors, respectively, and
   wherein a first transistor, which is connected to a second transistor that is in an on-state among the second transistors, is set as a test target.

8. The integrated circuit according to claim 7, wherein the circuit further comprises:
   a third transistor which is connected to the first transistors via the second transistors, and
   a fourth transistor which is connected to the first transistors via the second transistors, and
   wherein an on-resistance of the third transistor is smaller than an on-resistance of the fourth transistor.

9. The integrated circuit according to claim 8, wherein:
   the third transistor is turned on in a first test mode of verifying presence or absence of the first transistor that is in a constantly off state, and
   the fourth transistor is turned on in a second test mode of verifying presence or absence of the first transistor that is in a constantly off state.

10. The integrated circuit according to claim 9, wherein the circuit further comprises a switching unit that performs setting such that any one of the first test mode and the second test mode is valid.

11. The integrated circuit according to claim 8, wherein a value obtained by combining an on-resistance of the second transistor and an on-resistance of the third transistor is smaller than a value of an off-resistance of the first transistor having a constantly-off fault, and is larger than a value of an ideal on-resistance of the first transistor.

12. The integrated circuit according to claim 8, wherein a value obtained by combining an on-resistance of the second transistor and an on-resistance of the fourth transistor is smaller than a value of an ideal off-resistance of the first transistor, and is larger than a value of an on-resistance of the first transistor having a constantly-on fault.

* * * * *